United States Patent [19]

Zakaluk et al.

[11] Patent Number: 5,360,509
[45] Date of Patent: Nov. 1, 1994

[54] LOW COST METHOD OF FABRICATING EPITAXIAL SEMICONDUCTOR DEVICES

[75] Inventors: Gregory Zakaluk, Seaford; Dennis Garbis, Huntington Station; Joseph Y. Chan, Kings Park; John Latza, Lindenhurst; Lawrence LaTerza, Miller Place, all of N.Y.

[73] Assignee: GI Corporation, Hatboro, Pa.

[21] Appl. No.: 21,130

[22] Filed: Mar. 8, 1993

[51] Int. Cl.$^5$ ......................................... H01L 21/306
[52] U.S. Cl. ................................... 156/645; 156/626; 156/643; 437/225
[58] Field of Search ...................... 156/645, 643, 626; 437/225, 228, 243, 244; 148/DIG.; 134/902

[56] References Cited

U.S. PATENT DOCUMENTS

| | | | |
|---|---|---|---|
| 4,711,256 | 12/1987 | Kaiser | 148/DIG. 17 |
| 5,104,828 | 4/1992 | Morimoto et al. | 156/645 |
| 5,137,597 | 8/1992 | Curry, II et al. | 156/645 |
| 5,190,064 | 3/1993 | Aigo | 134/902 |
| 5,201,958 | 4/1993 | Breunsbach et al. | 134/902 |
| 5,223,080 | 6/1993 | Ohta et al. | 156/626 |
| 5,227,339 | 7/1993 | Kishii | 437/225 |
| 5,240,883 | 8/1993 | Abe et al. | 437/228 |

OTHER PUBLICATIONS

"Flat Grinding of Semiconductor Wafers"—Hinzen; Semiconductors IDR 3, 1992.
"A future technology for silicon wafer processing for ULSI"—Abe; Precision Engineering Oct. 1991, pp. 251–255.
"Background Wafers for Maximum Die Strength"—Lewis; Semiconductor International, Jul. 1992, pp. 86–89.
"Internal gettering heat treatments and oxygen precipitation in epitaxial silicon wafers"—Wijaranakula, Burke and Forbes; Journal of Materials Research, vol. 1, No. 5, Sep./Oct. 1986, pp. 693–697.
"Epi's Leading Edge"—Burggraaf; Semiconductor International, Jun. 1991, pp. 68–71.
"Mirror Surface Grinding of Silicon Wafer with Electrolytic in Process Dressing"—Ohmori and Nakatawa.

Primary Examiner—Tom Thomas
Assistant Examiner—Kevin M. Picardat
Attorney, Agent, or Firm—James & Franklin

[57] ABSTRACT

Significant reductions in the cost of fabrication of epitaxial semiconductor devices without sacrifice of functional characteristics is achieved by eliminating the conventional but costly polishing procedure, instead subjecting the substrate to grinding, cleaning and etching processes in which the grinding removes material from the surface to a depth of at least 65 microns and the etching further removes material to a depth of about 6–10 microns, the grinding preferably being carried out in two steps, the first being a coarse step and the second being a fine step, with the rotated grinding elements dwelling at their respective last grinding positions for a short period of time. The result is the equivalent of the prior art polishing procedure which took considerably longer to carry out and which therefore was much more costly. Complementing this grinding procedure is an improved and cost effective epitaxial process utilizing a unique two-step hydrochloric gas high temperature etch and a faster growth rate process with shorter cycle steps. In addition, oxygen control and "gettering" capabilities result in a total process improving the economics of formation of epitaxial semiconductor devices.

25 Claims, No Drawings

LOW COST METHOD OF FABRICATING EPITAXIAL SEMICONDUCTOR DEVICES

The present invention relates to a novel method of fabricating epitaxial semiconductor devices on a substrate, which method is much less costly than prior art polishing methods, yet which results in devices functionally the equal of those conventionally produced.

Silicon epitaxial layers are conventionally grown on a mirror-like polished surface, thereby to produce the desired damage-free epitaxial layer. To produce such a polished surface is expensive and labor intensive, but the polishing procedure has nevertheless been for some time the conventional procedure despite its economic drawbacks. Many steps are required to obtain the prior art mirror-like polished surface. Industry standard steps that evolved include saw slicing, mechanical lapping, cleaning, edge rounding, caustic etch, another cleaning, followed by a multi-step, chemical and mechanical, polishing, with a final cleaning step before packaging. The polished surfaces thus produced are very prone to damage by handling or otherwise.

Grinding of substrates is, of course, known. Backside grinding of the substrate is conventionally carried out to reduce overall thickness of silicon wafers. However, so far as is known, the use of grinding to produce the desired mirror-like surfaces of epitaxial devices has not been practiced in the past.

In accordance with the present invention, the conventional back-side grinding process has been modified, and other fabrication steps have been employed and adjusted, in order to produce the desired optimum mirror-like surface on the wafer in but a fraction of the time previously required when polishing was employed. With mechanically polished devices the overall process time for the substrate is about two days, but with the process here disclosed only about one hour of processing time is involved. Polishing alone, in the prior art, has taken one to two hours, whereas the grinding in the present process takes but two to four minutes. The grinding is followed in the present process by an etching step, but that etching step takes only about nine minutes. Hence the time comparison of the present process as compared to the polishing process involves the comparison between eleven minutes and one to two hours. The consequent fabrication cost reduction is obvious.

It is the prime object of the present invention to devise a process for the formation of epitaxial semiconductor devices on a substrate which will be less time consuming and costly than prior art methods yet which will produce semiconductor devices of equal functional quality when compared to devices made by the prior art polishing process.

The first step in the process of the present invention is, as has been indicated, the use of grinding, and not polishing, to produce the desired surface on which to form the epitaxial layer. That grinding is best carried out at high rotational speeds of the cutting wheels in order to optimize the surface finish that is produced and reduce internal structural stresses. A speed of 4000–4300 rpm has been found to be appropriate. In addition, it has been found to be preferable to carry out the grinding process in two steps using diamond grinding wheels of different degrees of fineness. In the first step the grinding wheel has a grit of a 40–60 micron size to produce a comparatively coarse grinding step, and in the second step the grinding wheel has a 4–6 micron grit to produce a fine grinding step. The coarse grinding is carried out so as to produce a depth reduction of no less than 50 microns, while the fine grinding step is carried out to remove 15–30 or 40 microns. The material removal rate in each step preferably does not exceed one micron per second. The removal rate can be slower, with the removal rate of approximately one-half micron per second being optimum in many situations. During this grinding the surfaces being ground must be lubricated and cooled, and hence an excess of deionized cooling water is provided, at a rate of at least 4 gallons per minute, with a rate of 5 gallons per minute being preferred. Moreover, it has been found desirable, in order to minimize residual surface damage which might otherwise result from the use of a grinding process, that the grinding wheels both at the end of the coarse grinding step and of the fine grinding step be caused to dwell at a fixed position corresponding to their final positions after the desired amount of material has been removed. The dwell time at the end of the coarse grinding step is at least 10–30 seconds, with 10 seconds being preferred, and the dwell time at the end of the fine grinding step is 20 seconds or more, with 20 seconds being preferred.

After grinding the silicon surface should be kept wet to prevent any residual contaminants from settling on it. Hence the wafer, and preferably a group of ground wafers, are sprayed with a deionized water mist and then transferred to an ultrasonic cleaner where it is subjected to a surfactant type cleaning for at least 30 minutes. The surfactant is then rinsed off with deionized water preferably having a resistance of about 18 megohms, after which the final cleaning is a modified industry standard cleaning generally designated megasonic (40°–60° C.) SC1 and SC2. The SC1 wash is preferably formed of one part hydrogen peroxide, one part ammonium hydroxide and 10 parts of water by volume, while the SC2 wash is preferably formed of one part of hydrogen peroxide and one part of hydrogen chloride in 10 parts of water by volume.

The wafer is now ready for the epitaxial deposition process. It is preferred that it have an oxygen content of between about 25–40 parts per million absolute, with a preferred content of about 30 parts per million absolute.

The epitaxial deposition process is also preferably a two-step process. In the first step the wafer is provided with a surface etch at an elevated temperature of about 1150° C. to remove any residual scratches and possible remaining contaminants. This etching is accomplished with hydrochloric gas at a temperature of about 1150° C. in a hydrogen atmosphere, and is preferably carried out in two steps, the first step involving a high rate of hydrochloric gas flow (90% gas injection), the second step involving a reduced flow of about 40% gas injection. The etching is carried out to remove about 6–10 microns of material, with a value of 7 microns being preferred, and at the end of the etching a mirror-like finish exists ready to be subjected to epitaxial deposition.

The second part of the epitaxy process is the growth of a doped silicon layer or layers, and it may be noted that because of the particular preliminary steps to which the wafer has been subjected the rate of the growth process can be effectively speeded up by controlling the flow of the gases which produced the epitaxial layer. While conventionally gas flow during the epitaxy process is about 100 feet per second, it has been found feasible to subject the wafers produced by the present method to gas velocities of between 350–450 feet per second, with 400 feet per second being preferred. This higher velocity of gas flow increases the efficiency of the epitaxial layer producing material, thus increasing the normal growth rate by about one-half micron per minute to produce a total deposition growth rate of about 2.7 microns per minute. This faster growth rate reduces the growth time which further reduces the cycle time and the overall cost of the process.

It should be noted, of course, that at the same time the epitaxial layers are grown and the doping is formed in them, something not broadly new in itself, but new here for the level of hydrochloric gas etching that is involved.

It may be noted that in the conventional polishing process the back side of the wafer is conventionally lapped, followed by a caustic etching which removes material to a depth of only 2–4 microns. This made the wafers very sensitive to residual stresses if they are heated or cooled too rapidly. It has been found that when the present process is employed the lapping of the back side of the wafer is no longer required, and indeed, is contra-indicated. With the present process it is preferred that the back side of the wafer remain in its "as cut" condition, which not only reduces the susceptibility of the device to residual stresses, but also, because of the relative roughness of the back side, improves the "gettering" tendency of the device, in which impurities tend to migrate to the back side during the high temperature process steps.

Wafers, when processed as described above and fabricated into discrete devices, produce devices which are equivalent in quality, yield and performance to devices formed by epitaxial growth on standard polished (chemical/mechanical) wafers. However, the manufactured cost of devices made according to the present invention can be as much as 50% less than the manufactured cost of the conventional polished wafers.

While only a limited number of embodiments of the present invention have been here specifically disclosed, it will be apparent that many variations may be made therein, all within the scope of the invention as defined in the following claims.

We claim:

1. The method of fabricating epitaxial semiconductor devices on a substrate which comprises:
   (1) subjecting the surface of said substrate on which epitaxial growth is to occur to a grinding process which removes material from said surface to a depth of at least 65 microns;
   (2) cleaning said surface without polishing it;
   (3) gas etching away said unpolished surface to a depth of about 6–10 microns; and
   (4) subjecting said surface to a chemical vapor deposition process, thereby to grow a doped layer on said surface.

2. The method of claim 1, in which in step 4 the chemical gas flow is supplied at a velocity of about 350–450 feet per second.

3. The method of either of claims 1 or 2, in which the surface of said substrate opposite that on which said epitaxial growth occurs remains in its "as cut" condition.

4. The method of either of claims 1 or 2, in which said substrate is silicon having an oxygen content of between about 25–40 parts per million absolute.

5. The method of claim 4, in which the oxygen content of said substrate is about 30 parts per million absolute.

6. The method of either of claims 1 or 2, in which said grinding process comprises a coarse grinding step in which the grinding element has a grit size of between about 40–60 microns followed by a fine grinding step in which said grinding element has a grit size of about 4–6 microns.

7. The method of claim 6, in which said coarse grinding step removes material from said surface to a depth of at least about 50 microns, and in which said fine grinding step removes material therefrom to a depth of about 15–40 microns.

8. The method of claim 6, in which the rate of material removal during said grinding process is less than about 1 micron per second.

9. The process of claim 6, in which the rotational speed of the grinding elements used in said grinding process is about at least 4000–4300 rpm.

10. The process of claim 6, in which, after the grinding element in each of said grinding steps has been advanced to remove the desired amount of material from said surface, the rotated grinding element is caused to dwell at its last grinding position for at least about 10–30 seconds after the coarse grinding step and at least about 10–20 seconds after the fine grinding step.

11. The process of claim 7, in which, after the grinding element in each of said grinding steps has been advanced to remove the desired amount of material from said surface, the rotated grinding element is caused to dwell at its last grinding position for at least about 10–30 seconds after the coarse grinding step and at least about 10–20 seconds after the fine grinding step.

12. The process of claim 8, in which, after the grinding element in each of said grinding steps has been advanced to remove the desired amount of material from said surface, the rotated grinding element is caused to dwell at its last grinding position for at least about 10–30 seconds after the coarse grinding step and at least about 10–20 seconds after the fine grinding step.

13. The process of claim 9, in which, after the grinding element in each of said grinding steps has been advanced to remove the desired amount of material from said surface, the rotated grinding element is caused to dwell at its last grinding position for at least about 10–30 seconds after the coarse grinding step and at least about 10–20 seconds after the fine grinding step.

14. The method of claim 6, in which, during said grinding process, cooling water is directed onto said surface at the rate of at least 4 gallons per minute.

15. The method of either of claims 1 or 2, in which said cleaning process comprises ultrasonic cleaning with a high purity surfactant followed by the application of megasonic cleaning at 40°–60° C. of (a) a mixture of hydrogen peroxide and ammonium hydroxide in approximately equal parts with about 10 parts of water and thereafter (b) a combination of hydrogen peroxide and hydrochloric acid in approximately equal parts together with about 10 parts of water.

16. The method of either of claims 1 or 2, in which said etching step removes material from said surface to a depth of about 7 microns.

17. The method of claim 6, in which said etching step removes material from said surface to a depth of about 7 microns.

18. The method of either of claims 1 or 2, in which said etching step utilizes hydrochloric gas as the etchant, the hydrochloric acid being applied in two steps, the first step involving a hydrochloric acid concentration of about 90% and the second step involving a hydrochloric acid injection of about 40%, at an elevated temperature in a hydrogen atmosphere.

19. The method of fabricating epitaxial semiconductor devices on a substrate which comprises:
   (1) subjecting the surface of said substrate on which epitaxial growth is to occur to a coarse grinding step in which the grinding element has a grit size of between about 40–60 microns which removes material from said surface to a depth of at least about 50 microns, followed by a fine grinding step in which said grinding element has a grit size of about 4–6 microns, said fine grinding step removing material to a depth of about 15–40 microns, the rate of material removed during said grinding process being less than about 1 micron per second and the rotational speed of the grinding elements used in said grinding process being about at least 4000–4300 rpm;
   (2) cleaning said surface without polishing it with a high purity surfactant followed by a chemical cleaning process comprising the application of a mixture of hydrogen peroxide and ammonium hydroxide in approximately equal parts with about 10 parts of water followed by a mixture of hydrogen peroxide and hydrochloric acid in approximately equal parts with about 10 parts of water;
   (3) etching said unpolished surface with hydrochloric gas at an elevated temperature in a hydrogen atmosphere to a depth of about 6–10 microns; and
   (4) subjecting said surface to a chemical vapor deposition process, thereby to grow a doped layer on said surface.

20. The method of claim 19, in which the hydrochloric gas in said etching step is applied in two steps, the first step including a hydrochloric gas injection of about 90% and the second step involving a hydrochloric gas concentration of about 40%.

21. The method of either of claims 19 or 20, in which, during the chemical vapor deposition process, the chemical vapor is supplied at a velocity of about 350–450 feet per second.

22. The method of either of claims 19 or 20, in which, after the grinding element in each of the grinding steps has been advanced to remove the desired amount of material from said surface, the grinding element is caused to dwell in its last grinding position for at least about 10–30 seconds after the coarse grinding step and at least about 10–20 seconds after the fine grinding step.

23. The method of either of claims 19 or 20, in which, during said grinding, cooling water is directed onto said surface at the rate of at least 4 gallons per minute.

24. The method of either of claims 19 or 20, in which said substrate is silicon having an oxygen content of between about 25–40 parts per million absolute.

25. The method of either of claims 19 or 20, in which the surface of said substrate opposite that on which said epitaxial growth occurs remains in its "as cut" condition.

* * * * *